United States Patent
Ching et al.

(10) Patent No.: US 10,622,464 B2
(45) Date of Patent: *Apr. 14, 2020

(54) INTEGRATED CIRCUIT STRUCTURE WITH SUBSTRATE ISOLATION AND UN-DOPED CHANNEL

(71) Applicant: Taiwan Semiconductor Manufacturing Company, Ltd., Hsin-Chu (TW)

(72) Inventors: Kuo-Cheng Ching, Hsinchu County (TW); Guan-Lin Chen, Hsinchu County (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 5 days.

This patent is subject to a terminal disclaimer.

(21) Appl. No.: 16/220,297

(22) Filed: Dec. 14, 2018

(65) Prior Publication Data

US 2019/0123180 A1    Apr. 25, 2019

Related U.S. Application Data

(60) Continuation of application No. 15/339,423, filed on Oct. 31, 2016, now Pat. No. 10,170,592, which is a
(Continued)

(51) Int. Cl.
 *H01L 29/66* (2006.01)
 *H01L 29/78* (2006.01)
 *H01L 29/165* (2006.01)

(52) U.S. Cl.
 CPC ...... *H01L 29/66795* (2013.01); *H01L 29/165* (2013.01); *H01L 29/66545* (2013.01); *H01L 29/785* (2013.01); *H01L 29/7848* (2013.01)

(58) Field of Classification Search
None
See application file for complete search history.

(56) References Cited

U.S. PATENT DOCUMENTS 7,262,084 B2   8/2007 Zhu et al.
9,054,189 B1   6/2015 Kim et al.
(Continued)

FOREIGN PATENT DOCUMENTS

CN   102456579   5/2012
CN   103928515   7/2014
(Continued)

OTHER PUBLICATIONS

Korean Intellectual Property Office, Office Action dated Dec. 2, 2015, for Application No. 10-2014-0177640, 6 pages.

*Primary Examiner* — Daniel Whalen
(74) *Attorney, Agent, or Firm* — Haynes and Boone, LLP

(57) ABSTRACT

Integrated circuit devices, such as fin-like field effect transistors, and methods of fabricating thereof are disclosed herein. An exemplary device includes a fin that includes a first semiconductor layer and a second semiconductor layer disposed on the first semiconductor layer. The second semiconductor layer includes a partially oxidized portion and a completely oxidized portion. A third semiconductor layer is disposed on the partially oxidized portion of the second semiconductor layer, where a source region and a drain region are defined in the third semiconductor layer. A fourth semiconductor layer is disposed on the completely oxidized portion of the second semiconductor layer, where a channel region is defined in the fourth semiconductor layer between the source region and the drain region defined in the third semiconductor layer. A gate structure is disposed over the channel region defined in the fourth semiconductor layer of the fin.

20 Claims, 14 Drawing Sheets

Related U.S. Application Data division of application No. 14/500,606, filed on Sep. 29, 2014, now Pat. No. 9,484,461.

(56) References Cited

U.S. PATENT DOCUMENTS

| | | |
|---|---|---|
| 9,484,461 B2 * | 11/2016 | Ching .................. H01L 29/785 |
| 2010/0155827 A1 | 6/2010 | Kim et al. |
| 2011/0053361 A1 | 3/2011 | Muralidhar et al. |
| 2013/0200433 A1 | 8/2013 | Adam et al. |
| 2013/0320455 A1 | 12/2013 | Cappellani et al. |
| 2014/0061862 A1 | 3/2014 | Vega et al. |
| 2014/0175561 A1 | 6/2014 | Colinge et al. |
| 2014/0231872 A1 | 8/2014 | Colinge et al. |
| 2014/0285980 A1 | 9/2014 | Cappellani et al. |
| 2014/0312432 A1 * | 10/2014 | Ching ............... H01L 29/66795 |
| | | 257/401 |
| 2015/0108572 A1 | 4/2015 | Cheng et al. |
| 2015/0162436 A1 | 6/2015 | Toh et al. |
| 2016/0043225 A1 | 2/2016 | Ching et al. |

FOREIGN PATENT DOCUMENTS

| | | |
|---|---|---|
| CN | 103996709 | 8/2014 |
| KR | 1020140097501 | 8/2014 |

* cited by examiner

INTEGRATED CIRCUIT STRUCTURE WITH SUBSTRATE ISOLATION AND UN-DOPED CHANNEL

This is a continuation application of U.S. patent application Ser. No. 15/339,423, filed Oct. 31, 2016, now U.S. Pat. No. 10,170,592, which is a divisional application of U.S. patent application Ser. No. 14/500,606, filed Sep. 29, 2014, the entire disclosures of which are incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized. Similar developments in IC processing and manufacturing are needed. For example, a three dimensional transistor, such as a fin-like field-effect transistor (FinFET), has been introduced to replace a planar transistor. A FinFET can be thought of as a typical planar device extruded out of a substrate and into the gate. A typical FinFET is fabricated with a thin "fin" (or fin structure) extending up from a substrate. The channel of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

However, because of the complexity inherent in FinFETs and other nonplanar devices, a number of techniques used in manufacturing planar transistors are not well suited to fabricating nonplanar devices. As merely one example, conventional techniques for forming a compound semiconductor channel on an elementary semiconductor substrate may produce undesirable channel strains and/or lattice defects because of the different lattice structures of the different types of semiconductors. Likewise, conventional techniques are unable to effectively form a compound semiconductor oxide or other insulating feature between the channel region and the substrate. Therefore, while existing fabrication techniques have been generally adequate for planar devices, in order to continue to meet ever-increasing design requirements, further advances are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
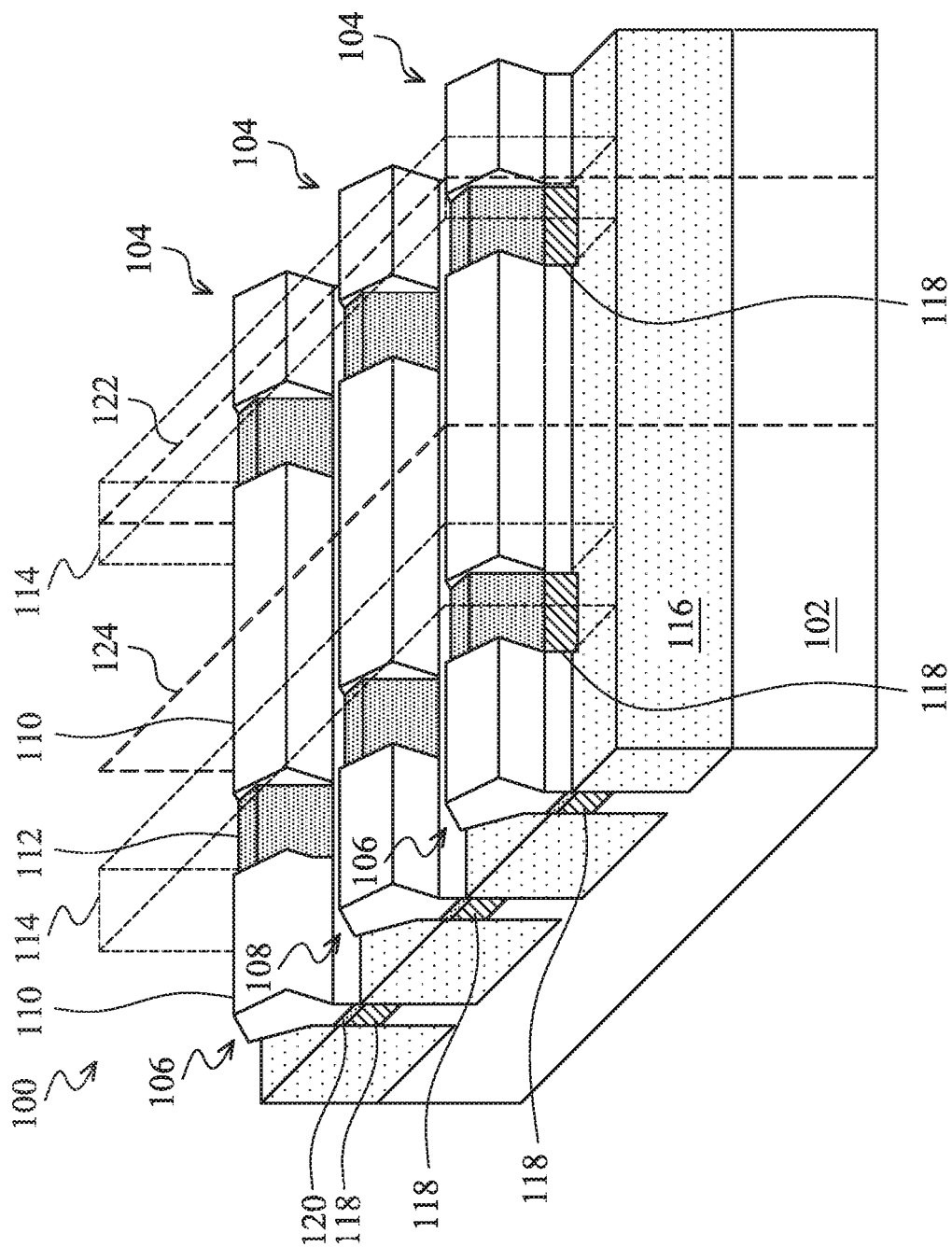
FIG. 1 is a perspective view of a semiconductor structure, constructed in accordance with some embodiments.

The present disclosure relates generally to IC device manufacturing and, more particularly, to an insulating layer that isolates a FinFET from a substrate upon which it is formed and to tuning the channel strain generated by the insulating layer to suit the channel type of the FinFET.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a Fin- FET example to illustrate various embodiments of the present invention. It is understood, however, that the application should not be limited to a particular type of device, except as specifically claimed.

FIG. 1 is a perspective view of a portion of a workpiece 100 according to various aspects of the present disclosure. FIG. 1 has been simplified for the sake of clarity and to better illustrate the concepts of the present disclosure. Additional features may be incorporated into the workpiece 100, and some of the features described below may be replaced or eliminated for other embodiments of the workpiece 100.

The workpiece 100 includes a substrate 102 or wafer with a fin structure 104 formed upon it. The fin structure 104 has one or more raised active regions (or fin active regions), and while the illustrated embodiments include a FinFET fin structure 104, further embodiments include other raised active and passive devices formed upon the substrate 102. The illustrated fin structure 104 include FinFETs, such as exemplary an n-channel (NMOS) FinFET 106 and a p-channel (PMOS) FinFET 108. In turn, each of FinFETs 106 and 108 includes a pair of opposing source/drain regions (or source/drain features) 110, which may include various doped semiconductor materials, and a channel region 112 disposed between the source/drain regions 110. The flow of carriers (electrons for the n-channel device and holes for the p-channel device) through the channel region 112 is controlled by a voltage applied to a gate stack 114 adjacent to and overwrapping the channel region 112. The gate stack 114 is shown as translucent to better illustrate the underlying channel region 112. In the illustrated embodiment, the channel region 112 rises above the plane of the substrate 102 upon which it is formed, and accordingly, the fin structure 114 may be referred to as a "nonplanar" device. The raised channel region 112 provides a larger surface area proximate to the gate stack 114 than comparable planar devices. This strengthens the electromagnetic field interactions between the gate stack 114 and the channel region 112, which may reduce threshold voltage, leakage and short channel effects associated with smaller devices. Thus in many embodiments, FinFETS and other nonplanar devices deliver better performance in a smaller footprint than their planar counterparts.

As described in more detail below, the fin structure 104 are formed on a semiconductor substrate 102. To electrically isolate the corresponding FinFETS 106 and 108 from the semiconductor substrate 102, the fin structure 104 are separated by isolation features 116 horizontally and buried isolation layer 118 vertically. In various embodiments, the methods and structures of the present disclosure provides a buried isolation layer 118 for FinFETs. The buried isolation layer 118 includes semiconductor oxide material to electrically separate the active regions from the substrate, thereby reducing or eliminating the punch-through effect and enhancing the device performance. In some embodiments, an additional semiconductor layer 120 is formed on the buried isolation layer 118. The semiconductor layer 120 may have a compound semiconductor material different from semiconductor material of the fin structure 104 (raised active regions). In the present embodiment, the semiconductor material of the fin structure 104 includes silicon and the semiconductor material of the semiconductor layer 120 includes silicon germanium (SiGe). In furtherance of the embodiment, the buried isolation layer 118 includes silicon germanium oxide.

In the present embodiment, the structure and the method of the present disclosure provides the channel regions 114 that is un-doped and has higher carrier mobility and further enhanced device performance, such as increased device speed. In some other embodiments, the channel region 114 may be alternatively doped with proper types of dopants.

Figure 2:
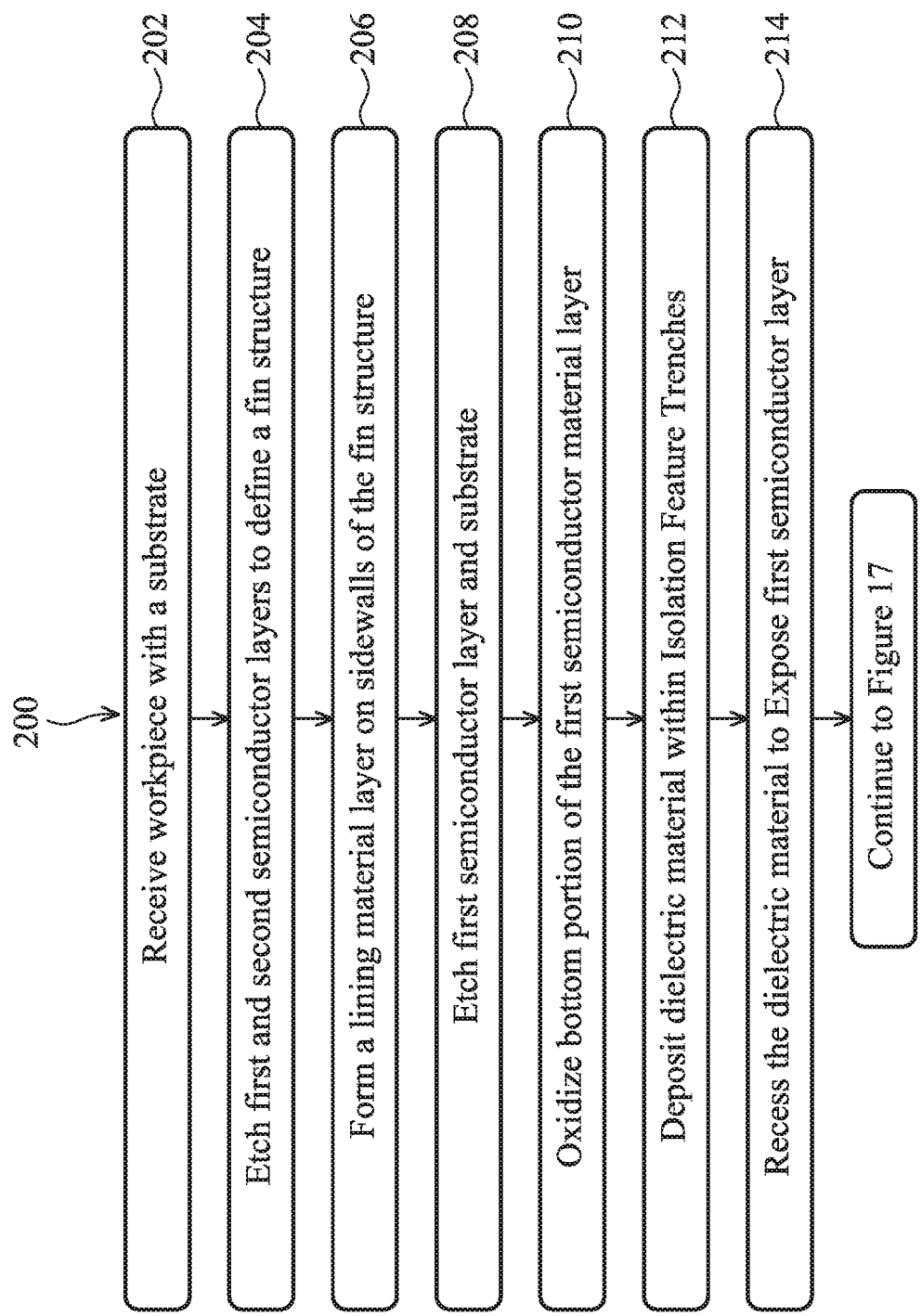
FIG. 2 is a flowchart of an integrated circuit fabrication method in accordance with some embodiments.

Exemplary methods of forming the workpiece 100 having FinFET devices (such as 106 and 108) will now be described with reference to FIGS. 2-17. FIG. 2 is a flowchart of a method 200 for fabricating a FinFET or other fin-based device on a workpiece 100 according to various aspects of the present disclosure. The figures that follow refer perspective views of the workpiece 100, and/or cross-sections taken through the channel region 112 (e.g., along plane 122) or through the source/drain regions 110 (e.g., along plane 124) of the FinFET devices.

The method 200 and the structure of the workpiece 100 are collectively described according to various aspects of the present disclosure. It is understood that additional steps can be provided before, during, and after the method 200 and that some of the steps described can be replaced or eliminated for other embodiments of the method.

Figure 3:
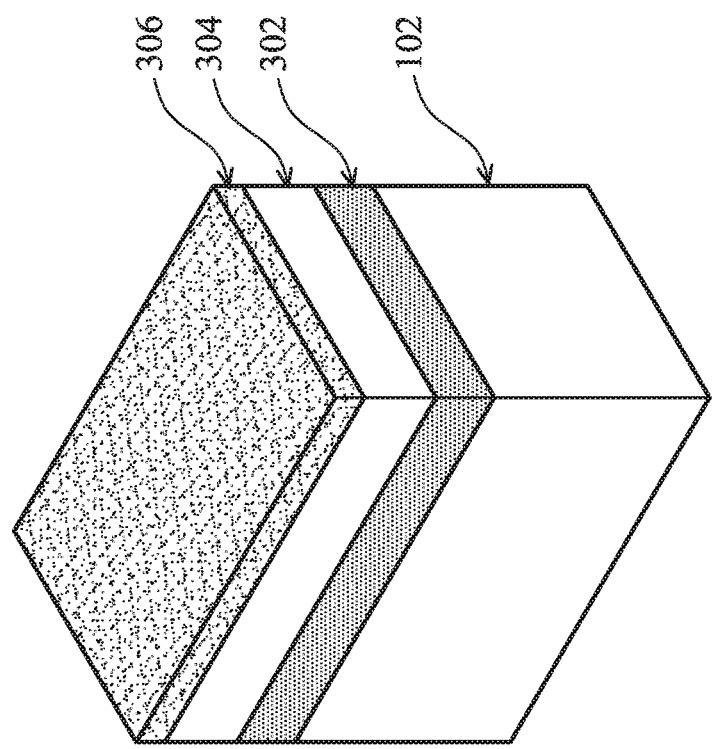

Referring first to block 202 of FIG. 2 and to FIG. 3, a workpiece 100 is received that includes a substrate 102. Suitable substrates 102 include a bulk silicon substrate. Alternatively, the substrate 102 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 102 also include a silicon-on-insulator (SOI) substrate. SOI substrates are fabricated using separation by implantation of oxygen (SIMOX), wafer bonding, and/or other suitable methods.

The received workpiece 100 may have one or more layers already formed upon it. In the illustrated embodiment, the workpiece 100 includes a first semiconductor layer 302 formed on the substrate 102 and a second semiconductor layer 304 formed on the first semiconductor buried layer. The first semiconductor layer 302 includes a first semiconductor material and the second semiconductor layer 304 includes a second semiconductor material different from the first semiconductor material. The first and second semiconductor layers epitaxially grown by suitable techniques, such as selective epitaxy growth (SEG).

The first semiconductor layer 302 may include a compound semiconductor formed on and physically contacting an elementary semiconductor of the substrate 102. In the present embodiment, the substrate 102 is a silicon substrate, the first semiconductor material is silicon germanium (SiGe) and the second semiconductor material is silicon. In some embodiments, the first semiconductor layer 302 includes SiGe with a Ge concentration of between about 20 atomic percent and about 35 atomic percent. Accordingly, the first semiconductor layer 302 may have an intermediate Ge concentration such as between about 20 atomic percent and about 35 atomic percent without introducing significant dislocation defects. In further embodiments, the first semiconductor layer 302 has a Ge gradient such that a portion of the semiconductor layer 302 closest to and contacting the substrate 102 has a Ge concentration between about 20 atomic percent and about 35 atomic percent, while a portion of the first semiconductor layer 302 furthest from the substrate 102 has a Ge concentration of about 60 atomic percent.

The first semiconductor layer 302 may be formed by suitable techniques. In some embodiments, the first semiconductor layer 302 may be formed on the substrate 102 by any suitable process to epitaxially grow the first semiconductor layer 302. Suitable deposition processes include atomic layer deposition (ALD), chemical vapor deposition (CVD), high-density plasma CVD (HDP-CVD), physical vapor deposition (PVD) and/or other suitable deposition processes. Any of these techniques may be used to grow a semiconductor layer 302 having any composition including a graduated composition. For example, in an exemplary epitaxial growth process, the concentration of a Ge-containing reaction gas (e.g., $GeH_4$) is varied over time as the first semiconductor layer 302 grows to deposit a first semiconductor layer 302 with a Ge gradient. The first semiconductor layer 302 may be formed to any suitable thickness, and in various embodiments, ranges in thickness from about 20 nm to about 90 nm.

In the illustrated embodiment, the second semiconductor layer 304 is formed on and directly contacting the first semiconductor layer 302. The second semiconductor layer 304 is processed to form the core of the fin structure 104 as described below. As such, the second semiconductor layer 304 may include any suitable elementary or compound semiconductor, and in an exemplary embodiment, includes an elementary silicon semiconductor. Similar to the first semiconductor layer, the second semiconductor layer 304 may be epitaxially grown by ALD, CVD, HDP-CVD, PVD, and/or other suitable deposition processes.

In the present embodiment, the second semiconductor layer is formed without doping, therefore also referred to as un-doped semiconductor layer. For example, during the deposition, the precursor does not include dopant-containing chemical. In furtherance of the example, no further ion implantation is implemented to eliminate introduce dopant to the second semiconductor layer 304. In this embodiment, the formed channel region is un-doped and has fewer defects. This will be further described along with the fabrication of the workpiece 100.

To facilitate fabrication and to avoid damage to the semiconductor layer 304, one or more hard mask layers 306 may be formed on the semiconductor layer 304. The hard mask layers 306 include a dielectric such as a semiconductor oxide, a semiconductor nitride, a semiconductor oxynitride, and/or a semiconductor carbide, and in an exemplary embodiment, the hard mask layers 306 include a silicon oxide layer and a silicon nitride layer. The hard mask layers 306 may be formed by thermal growth, ALD, chemical vapor deposition (CVD), high-density plasma CVD (HDP-CVD), physical vapor deposition (PVD), and/or other suitable deposition processes.

A photoresist layer (or resist) used to define fin structure 104 in later operations of the method 200 may be formed on the hard mask layers 306. An exemplary resist layer includes a photosensitive material that causes the layer to undergo a property change when exposed to light. This property change can be used to selectively remove exposed or unexposed portions of the resist layer by a developing process referred. This procedure to form a patterned resist layer is also referred to as lithographic patterning.

In one embodiment, the resist layer is patterned to leave the portions of the photoresist material disposed over the fin structure 104 by the lithography process. After patterning the resist, an etching process is performed on the workpiece 100 to open the hard mask layers 306, thereby transferring the pattern from the resist layer to the hard mask layer 306. The remaining resist layer may be removed after the patterning the hard mask layer 306. An exemplary lithography process includes spin-on coating a resist layer, soft baking of the resist layer, mask aligning, exposure, post-exposure baking, developing the resist layer, rinsing, and drying (e.g., hard baking). Alternatively, a lithographic process may be implemented, supplemented, or replaced by other methods such as maskless photolithography, electron-beam writing, and ion-beam writing.

Figure 4:
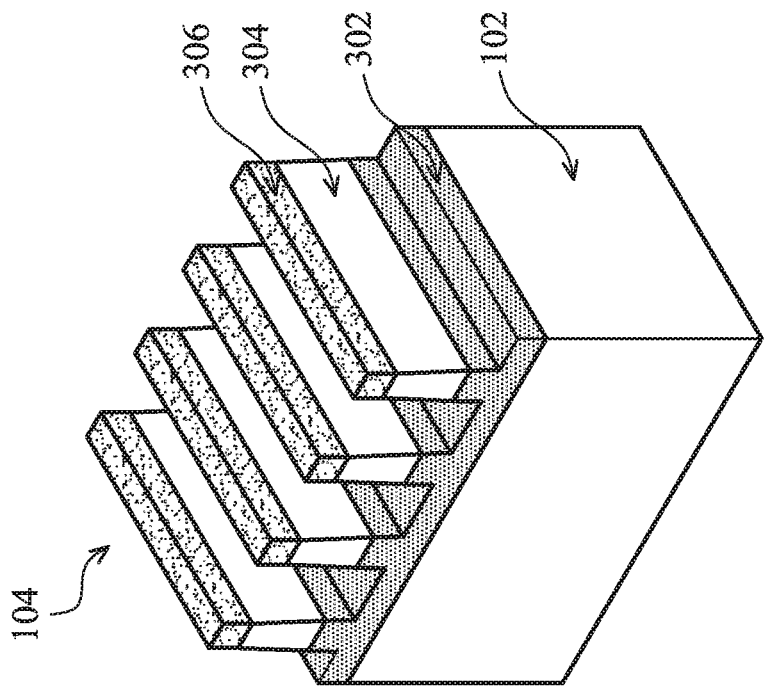
FIGS. 3, 4, 5, 6, 7, 8, 9, 10, and 11 are perspective views of a semiconductor structure at various fabrication stages, constructed in accordance with some embodiments.

Referring to block 204 of FIG. 2 and to FIG. 4, the second semiconductor layer 304 and the first semiconductor layer 302 are etched to define the fin structure 104 through openings of the patterned hard mask layer.

One or more etching processes are performed on the workpiece 100 to etch the portions of the second semiconductor layer 304 and the first semiconductor layer 302 not covered by the patterned hard mask layer 306. The patterned hard mask layer 306 is used as an etch mask during the etching processes to pattern the semiconductor layers.

The etching processes may include any suitable etching technique such as dry etching, wet etching, and/or other etching methods (e.g., reactive ion etching (RIE)). In some embodiments, etching includes multiple etching steps with different etching chemistries, each targeting a particular material of the workpiece 100. For examples, in an embodiment, the silicon oxide film in the hard mask layer may be etched by a diluted hydrofluorine solution and the silicon nitride film in the hard mask layer may be etched by a phosphoric acid solution. In other embodiment, the first and second semiconductor layers are etched by a dry etching process using a fluorine-based etchant.

The etching processes are designed to produce fin structure 104 of any suitable height and width extending above the reminder of the first semiconductor layer 302. In addition to defining the fin structure 104, the etching of block 204 may also define one or more isolation feature trenches between the raised active regions of the fin structure 104.

Particularly, the etching operation applied to the first semiconductor layer 302 is controlled such that the semiconductor layer 302 is partially etched without etching through, as illustrated in FIG. 4. This may be achieved by controlling etching time relative to the thickness of the first semiconductor layer 302 or by controlling other etching parameter(s). After the etching processes, the fin structure is formed and extended from the second semiconductor material layer 304 to the first semiconductor material layer 302. The first semiconductor material layer 302 includes a bottom portion not patterned and a top portion patterned as a part of the fin structure 104.

Figure 5:
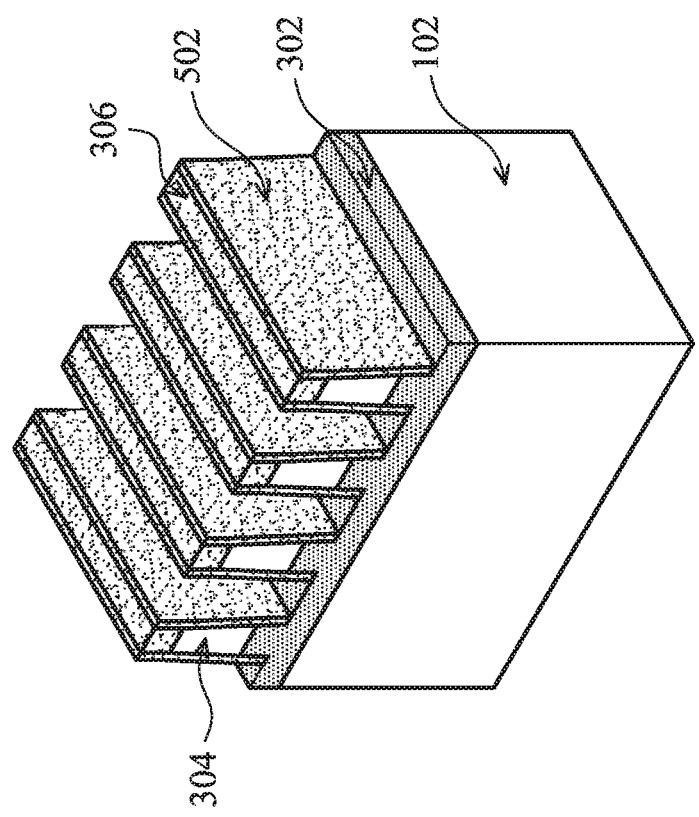

Referring to block 206 of FIG. 2 and to FIG. 5, a first liner (or second hard mask layer) 502 is formed over the fin structure 104 such that the sidewalls of the fin structure 104 are covered by the liner 502. The liner 502 is capable of protecting the top portion of the first semiconductor material layer 302 from subsequent etching. The liner 502 may include any suitable dielectric material, and an exemplary liner 502 includes a silicon nitride. In the illustrated embodiment, the liner 502 is formed on the upper surface of the fin structure 104 (i.e., on the upper surface of the hard mask layers 308), and on the sidewall surfaces of the fin structure 104. In this way, the liner 502 protects these exterior surfaces of the fin structure 104. The liner 502 may be formed by a procedure that includes deposition and anisotropic etching. Thus, the liner 502 is removed from the substrate 102 within the gaps between the fin active regions. The liner 502 may be removed from the top surfaces of the fin active regions as well. In some embodiments, the liner 502 is deposited by CVD and anisotropically etched by a dry etching. In some examples, the deposition of silicon nitride includes a CVD process with a precursor having hexachlorodisilane ($Si_2Cl_6$), dichlorosilane ($SiH_2Cl_2$), bis(tertiary-butylamino) Silane ($C_8H_{22}N_2Si$), and disilane ($Si_2H_6$), or a combination thereof. In some examples, the anisotropic etching includes a plasma etching process using fluorine-containing etchant.

Figure 6:
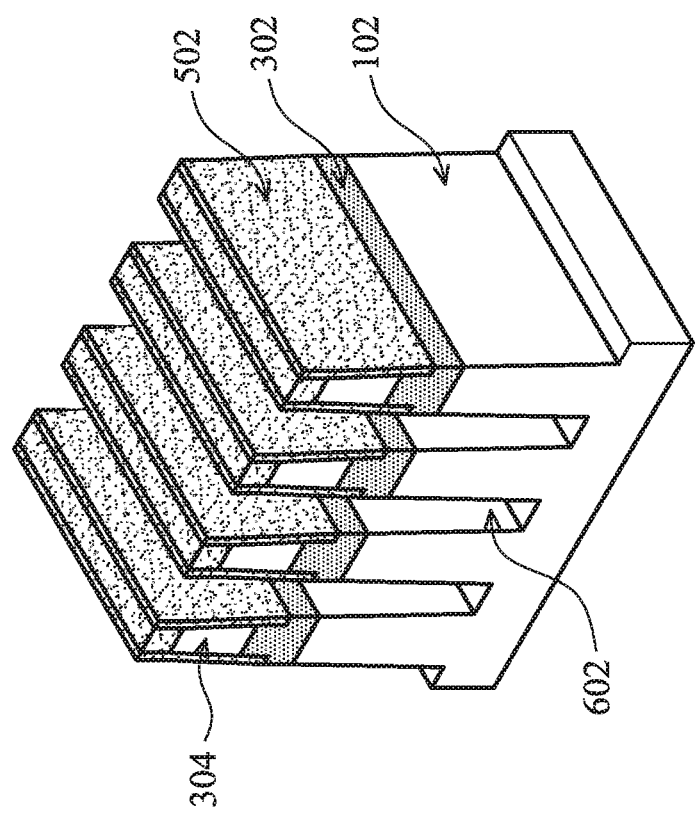

Referring to block 208 of FIG. 2 and to FIG. 6, the substrate 102 is etched within the gaps between the fin active regions using the liner 502 and the hard mask layer 306 as a collective etch mask. In the present embodiment, the etching process etches through the first semiconductor material layer 302 and continues etching to the substrate 102. The etching process may include any suitable etching technique such as dry etching, wet etching, and/or other etching methods (e.g., RIE). In some embodiments, the etching process includes multiple etching steps with different etching chemistries, each targeting a particular material of the workpiece 100. For examples, in an embodiment, the etching process includes a dry etching process using a fluorine-based etchant. By the etching process in the block 208, trenches 602 are formed in the substrate 102. The trenches 602 may be subsequently filled with a dielectric material to form an isolation feature, such as STI features.

Figure 7:
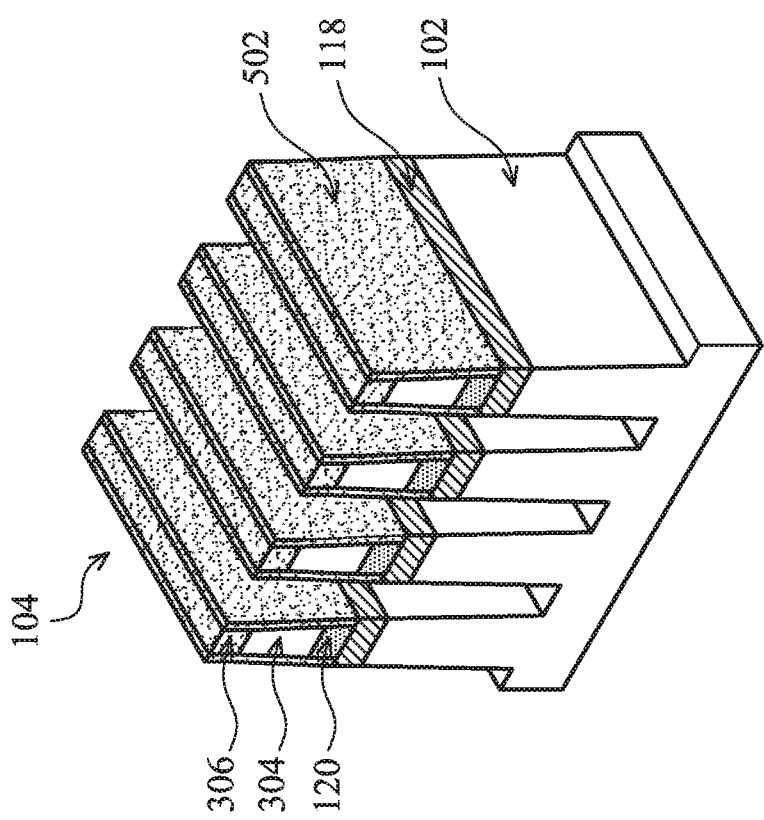

Referring to block 210 of FIG. 2 and to FIG. 7, the first semiconductor material layer 302 is oxidized. Particularly, the first semiconductor material in the bottom portion of the first semiconductor material layer 302 is oxidized and converts to semiconductor oxide layer 118, also referred to as buried isolation layer 118 in FIG. 1. In the present embodiment, the bottom portion of the first semiconductor material layer 302, which is uncovered by the liner 502, is fully oxidized during the oxidization process while the top portion of the first semiconductor material layer 302 is protected by the liner 502 from the oxidization. The top portion of the first semiconductor material layer 302, which is not oxidized, remains as a semiconductor layer and corresponds to the semiconductor layer 120 in FIG. 1. The oxidization process at the present operation is a selective oxidization tuned such that only the first semiconductor material is oxidized while the semiconductor material of the substrate 102, being different from the first semiconductor material in composition, is selectively not oxidized during the oxidization process.

In the present embodiment, the first semiconductor material of the first semiconductor material layer 302 is silicon germanium while the semiconductor materials of the substrate 102 and the second semiconductor material layer 304 are both silicon. The oxidization process is tuned to selectively oxidize silicon germanium. In furtherance of the embodiment, a wet oxidation process is used because it tends to selectively oxidize germanium within the first semiconductor material layer 302 without oxidizing silicon within the substrate 102 and/or the second semiconductor material layer 304. For example, the substrate 102 may be heated to and maintained at between about 400° C. and about 600° C. while pure water (vapor) is supplied to the substrate 102 in an environment maintained at about 1 Atm. of pressure for between about thirty minutes and about one hour. The oxidation technique forms a SiGe oxide buried isolation layer 118 separating the fin structure 104 and the substrate 102.

Figure 8:
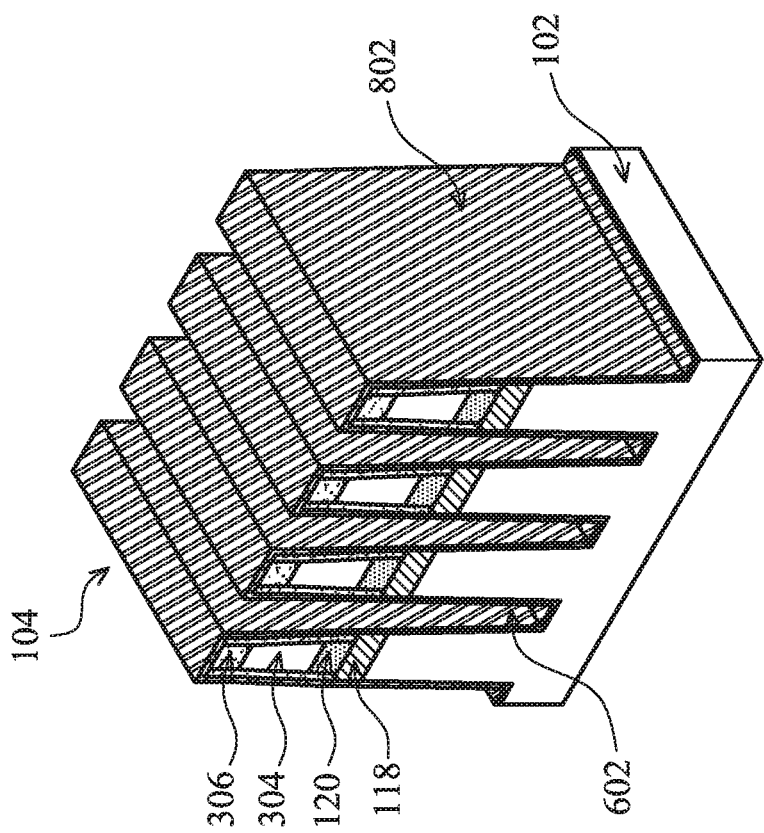

Referring to FIG. 8, in the present embodiment, a second liner 802 is formed on the substrate 102. The second liner 802 covers sidewalls of the fin structure 104 and the sidewalls of the trenches 602 in the substrate 102. The second liner 802 provides lining to the trenches 602 prior to subsequent processing. The liner reduces crystalline defects at the interface between the substrate 102 and the fill material. The liner may include any suitable material including a semiconductor nitride, a semiconductor oxide, a thermal semiconductor oxide, a semiconductor oxynitride, a polymer dielectric, and/or other suitable materials, and may be formed using any suitable deposition process including thermal growth, ALD, CVD, HDP-CVD, PVD, and/or other suitable deposition processes. In some embodiments, the liner includes a conventional thermal oxide liner formed by a thermal oxidation process. In some exemplary embodiments, the liner includes a semiconductor nitride formed via HDP-CVD.

Figure 9:
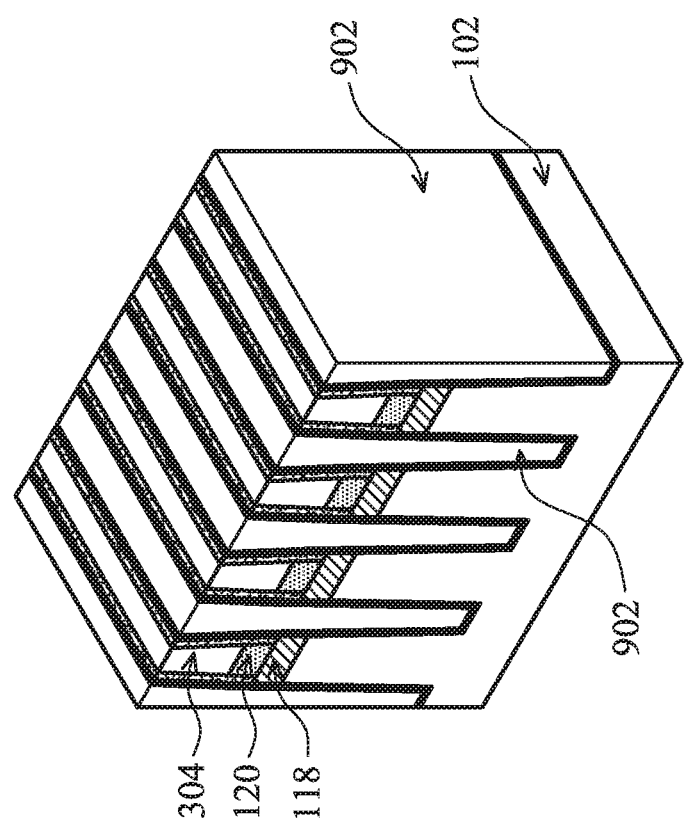

Referring to block 212 of FIG. 2 and to FIG. 9, isolation features 116 are formed on the substrate 102. STI or other type of isolation features may be formed between raised active regions of the fin structure 104 as shown in blocks 212-214. Referring to FIG. 9, a dielectric material 902 is deposited within the isolation feature trenches 602 to form the isolation features 116. Suitable fill materials 902 include semiconductor oxides, semiconductor nitrides, semiconductor oxynitrides, FSG, low-K dielectric materials, and/or combinations thereof. In various exemplary embodiments, the dielectric material 902 is deposited using a HDP-CVD process, a sub-atmospheric CVD (SACVD) process, a high-aspect ratio process (HARP), and/or a spin-on process. In one such embodiment, a CVD process is used to deposit a flowable dielectric material that includes both a dielectric material 902 and a solvent in a liquid or semiliquid state. A curing process is used to drive off the solvent, leaving behind the dielectric material 902 in its solid state.

The deposition of the dielectric material 902 may be followed by a chemical mechanical polishing/planarization (CMP) process. The CMP process may use the hard mask layers 306 as a polishing stop layer to prevent polishing the semiconductor layer 304. In the illustrated embodiment, the CMP process completely removes the hard mask layers 306, although in further embodiments, some portion of the hard mask layers 306 remain after the CMP process.

Figure 10:
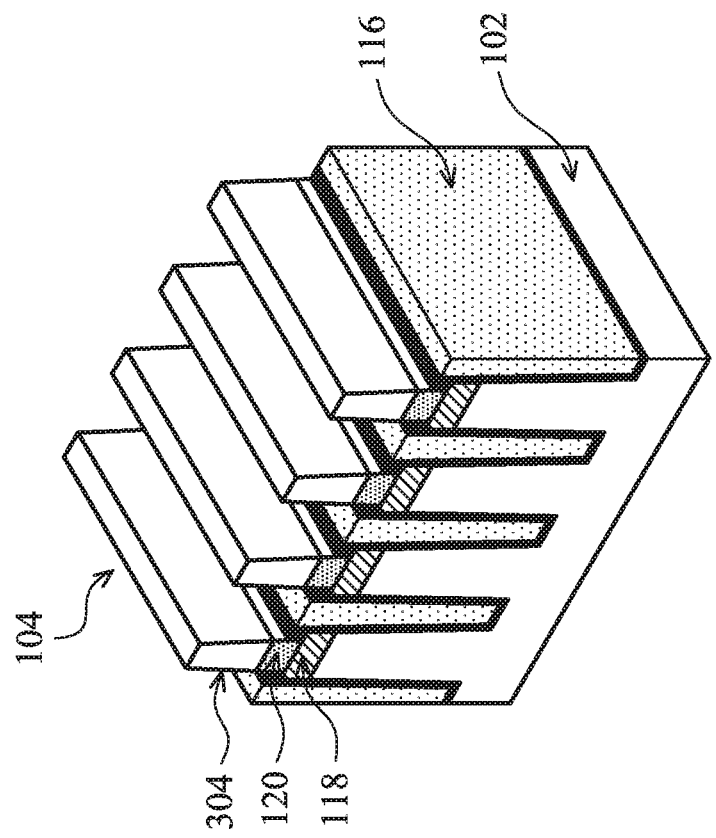

Referring to block 214 of FIG. 2 and to FIG. 10, the dielectric material 902 is recessed to expose the semiconductor layer 304, thereby forming raised active regions or fin structure 104. The fin active regions are electrically isolated from each other and from the substrate 102 by the buried isolation layer 118 and STI features 116. In the illustrated embodiment, the fill material 902 is recessed to expose the semiconductor layer 304 in its entirety. The semiconductor layer 120 is at least partially exposed such that the subsequent oxidization process can be applied to oxidize the semiconductor layer 120 within the channel region 112. In this embodiment, the fill material 902 is recessed until the upper surface of the fill material 902 is below the upper surfaces of the semiconductor layer 120 such that the semiconductor layer 120 is at least partially exposed. Any suitable etching technique may be used to recess the fill material 902 including dry etching, wet etching, RIE, and/or other etching methods, and in an exemplary embodiment, an anisotropic dry etching is used to selectively remove the fill material 902 without etching the semiconductor layer 304.

Figure 11:
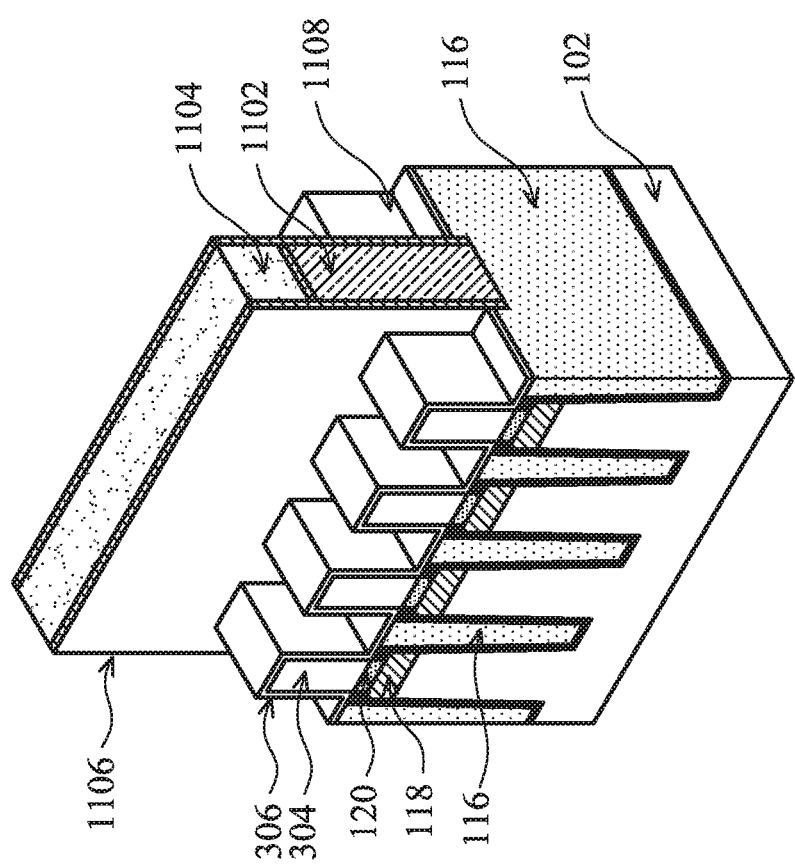

Referring to block 216 of FIG. 2 and to FIG. 11, a protective structure such as a dummy gate 1102 is formed over the channel region 112. Forming the dummy gate 1102 may include depositing a dummy gate layer containing polysilicon or other suitable material and patterning the layer in a lithographic process. A gate hard mask layer 1204 may be formed on the dummy gate layer 1202. The gate hard mask layer 1202 may include any suitable material, such as a silicon oxide, a silicon nitride, a silicon carbide, a silicon oxynitride, other suitable materials, and/or combinations thereof. The formation of the gate stack 1102 includes deposition of gate material layers and patterning the gate material layers. In some embodiments, the patterning process includes forming a patterned resist layer; etching the hard mask layer using the patterned resist layer as an etch mask; and etching the gate material layers using the patterned hard mask layer as an etch mask.

In some embodiments, gate spacers 1106 or sidewall spacers are formed on the sidewalls of the dummy gate 1102. The gate spacers 1206 may be used to offset the subsequently formed source/drain features and may be used for designing or modifying the source/drain structure (junction) profile. The gate spacers 1206 may include any suitable dielectric material, such as a semiconductor oxide, a semiconductor nitride, a semiconductor carbide, a semiconductor oxynitride, other suitable materials, and/or combinations thereof. The formation of the gate spacer includes deposition and anisotropic etching, such as dry etching.

Referring to block 218 of FIG. 2 and to FIG. 11, a hard mask 1108 is formed over the fin structure 104. The hard mask 1108 may be used as guiding feature used to align the epitaxial growth of the source/drain features in subsequent operations. The hard mask 1108 forms on the surfaces of the fin structure 104, including the upper surface and sidewall surfaces of the fin structure 104. The hard mask 1108 may include any suitable dielectric material including semiconductor oxides, semiconductor nitrides, semiconductor oxynitrides, semiconductor carbides, combinations thereof, and/or other suitable materials. An exemplary hard mask 1106 includes silicon nitride. In various embodiments, the hard mask layer 1108 is formed using one or more suitable processes including thermal growth, ALD, CVD, HDP-CVD, PVD, and/or other suitable deposition processes.

Figure 12B:
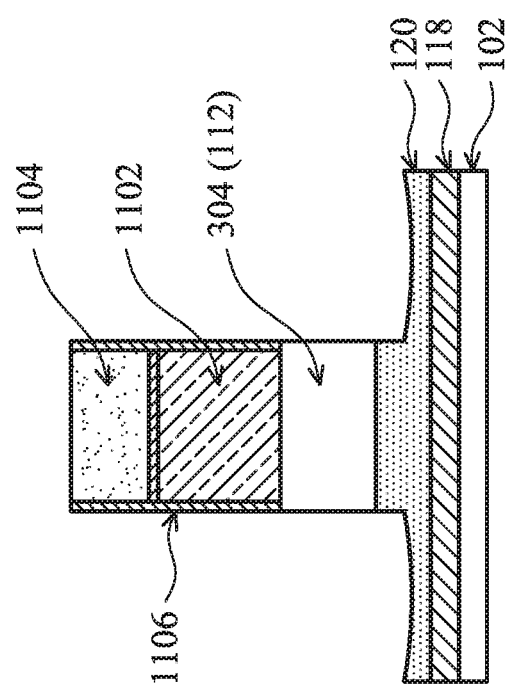
FIGS. 12B, 13B, 14B, 15B, and 16B, 16C, and 16D are sectional views of the semiconductor structure in FIGS. 12A through 16A, respectively, constructed in accordance with some embodiments.
Figure 12A:
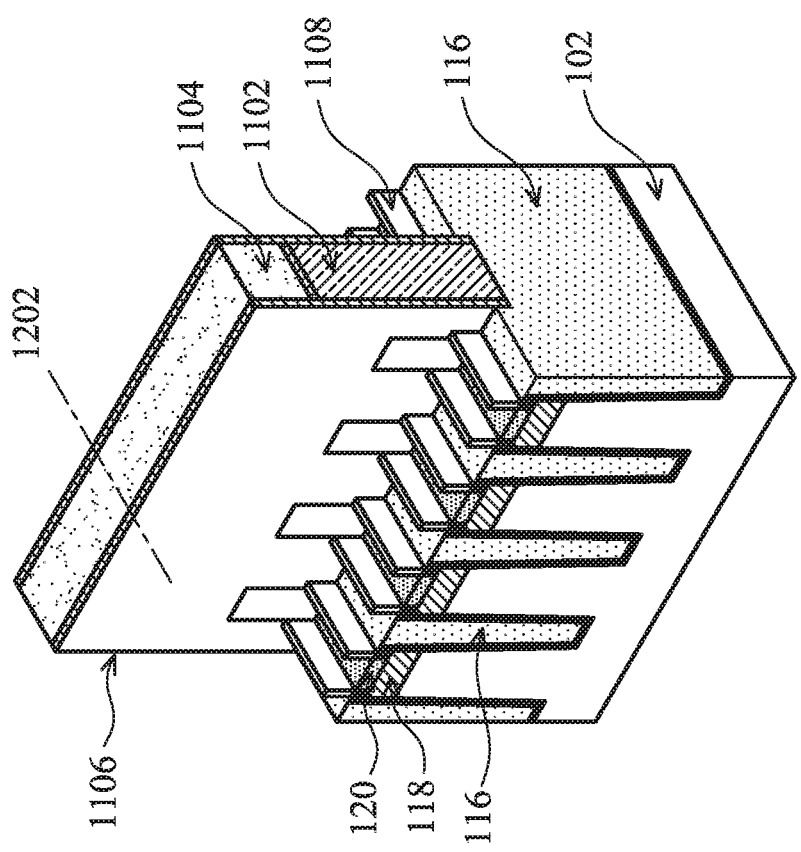
FIGS. 12A, 13A, 14A, 15A, and 16A are perspective views of the semiconductor structure at various fabrication stages, constructed in accordance with some embodiments.

Referring to block 220 of FIG. 2 and to FIGS. 12A and 12B, the hard mask 1108 within the source/drain regions 110 are etched. FIG. 12A is a schematic view and FIG. 12B is a sectional view of the workpiece 100 along a fin active region, as illustrated in the dashed line 1202. The etching leaves a portion of the semiconductor layer 302 remaining to act as a seed layer for a subsequent epitaxial growth process, the remaining portions of the semiconductor layer 302 is also referred to as semiconductor layer 120 in FIG. 1. In various embodiments, the semiconductor layer 120 remaining after the etching has a thickness between about 3 nm and about 10 nm. The technique may also leave a portion of the hard mask 1108 extending above the top surface of the semiconductor layer 120 in order to control and align the epitaxial growth of the source/drain features. The etching may be performed as a single etching process or as multiple etching processes using a variety of etchants and techniques. In an exemplary embodiment, an anisotropic (directional) etching technique, such as an anisotropic dry etching technique, is used that etches the horizontal surfaces of the hard mask 1108. In another exemplary embodiment, the etching includes multiple etching steps that further includes an anisotropic etching step to remove the top portion of the hard mask 1108 on the semiconductor layer 120, and a selective etching step (such as a wet etching) to selectively remove the second semiconductor layer 304. The semiconductor layer 120 may be partially removed during the etching.

In FIG. 12B, the semiconductor layer 304 underlying the gate stack 1102 corresponds to the channel region 112. In some embodiments, the channel region 112 is un-doped, as described above. Accordingly, the channel defects are reduced, the carrier mobility is increased, and the device performance is enhanced.

Figure 13B:
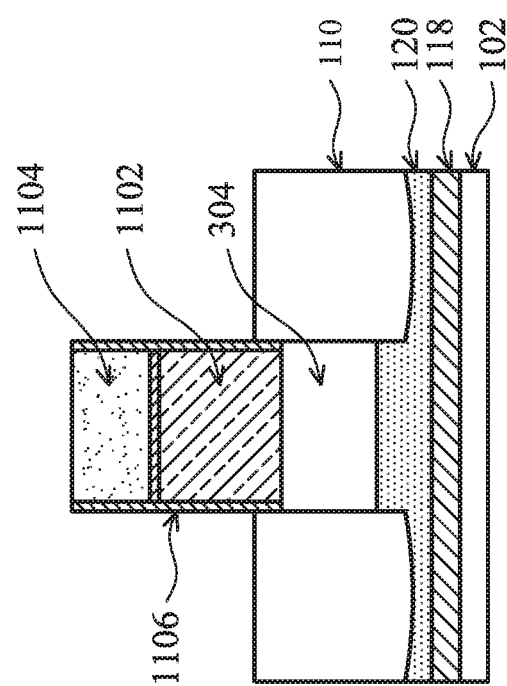
Figure 13A:
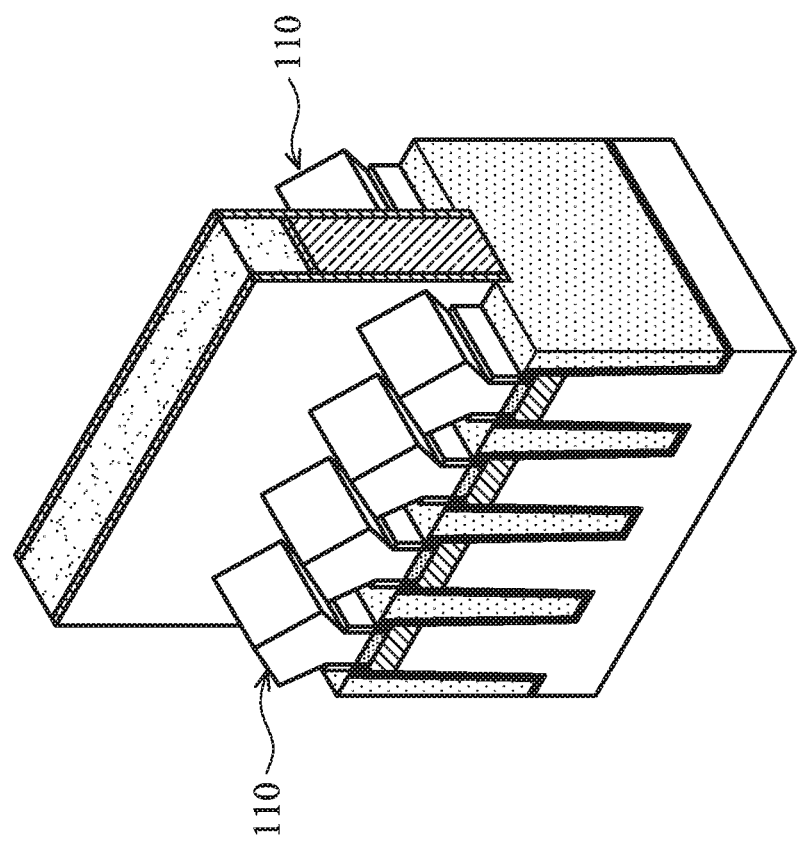

Referring to block 222 of FIG. 2 and to FIGS. 13A and 13B, raised source/drain (S/D) features 110 are formed on the semiconductor layer 120. The dummy gate 1102 and/or gate spacers 1106 limit the source/drain features 110 to the source/drain regions 110, and the hard mask 1108 limits the source/drain features horizontally within the source/drain regions 110. In many embodiments, the source/drain features 110 are formed by one or more epitaxy or epitaxial (epi) processes, whereby Si features, SiGe features, SiC features, and/or other suitable features are grown in a crystalline state on the fin structure 104. Suitable epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin structure 104.

The source/drain features 110 may be in-situ doped during the epitaxy process by introducing doping species including: p-type dopants, such as boron or $BF_2$; n-type dopants, such as phosphorus or arsenic; and/or other suitable dopants including combinations thereof. If the source/drain features 110 are not in-situ doped, an implantation process (i.e., a junction implant process) is performed to dope the source/drain features 110. In an exemplary embodiment, the source/drain features 110 in an NMOS include SiCP or SiP, while those in a PMOS include GeSnB (tin may be used to tune the lattice constant) and/or SiGeSnB. One or more annealing processes may be performed to activate the source/drain features 110. Suitable annealing processes include rapid thermal annealing (RTA) and/or laser annealing processes.

Figure 14B:
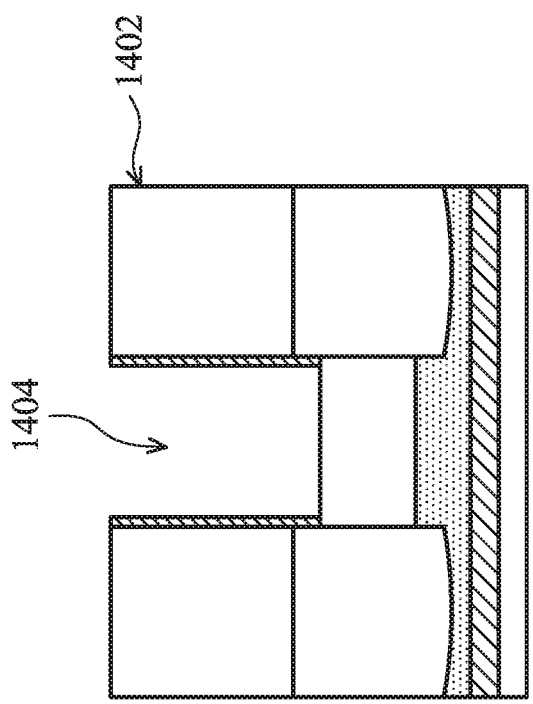
Figure 14A:
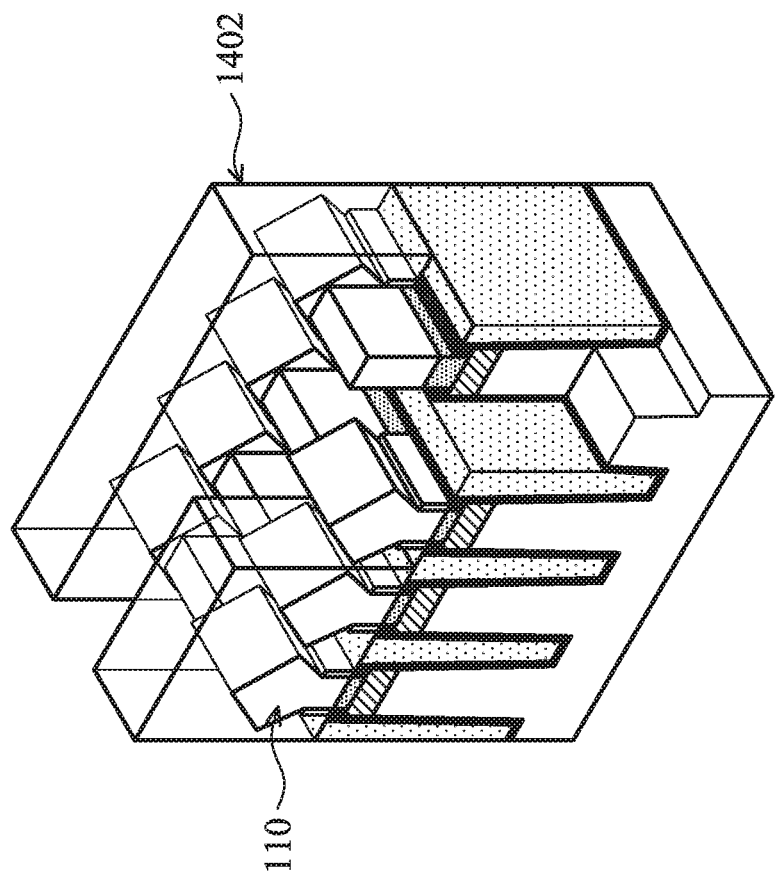

Referring to block 224 of FIG. 2 and to FIGS. 14A and 14B, an inter-level dielectric (ILD) 1402 is formed on the source/drain features 110 in the source/drain regions 110. The ILD 1402 may surround the dummy gate 1102 and/or gate spacers 1106 allowing these features to be removed and a replacement gate 114 to be formed in the resulting cavity. Accordingly, in such embodiments, the dummy gate 1102 is removed after depositing the ILD 1402 as shown in FIG. 14A. The ILD 1402 may also be part of an electrical interconnect structure that electrically interconnects the devices of the workpiece. In such embodiments, the ILD 1402 acts as an insulator that supports and isolates the conductive traces. The ILD 1402 may include any suitable dielectric material, such as a semiconductor oxide, a semiconductor nitride, a semiconductor oxynitride, a semiconductor carbide, other suitable materials, and/or combinations thereof. In some embodiments, the formation of the ILD 1402 includes deposition and CMP.

Referring to block 226 of FIG. 2 and to FIGS. 14A and 14B, the dummy gate stack 1102 is removed, resulting in a gate trench 1404. In some embodiments, the dummy gate stack is removed by a process, such as a wet etch, to selectively the dummy gate stack. The etching may include multiple etching steps to respective dummy gate layers.

Figure 15B:
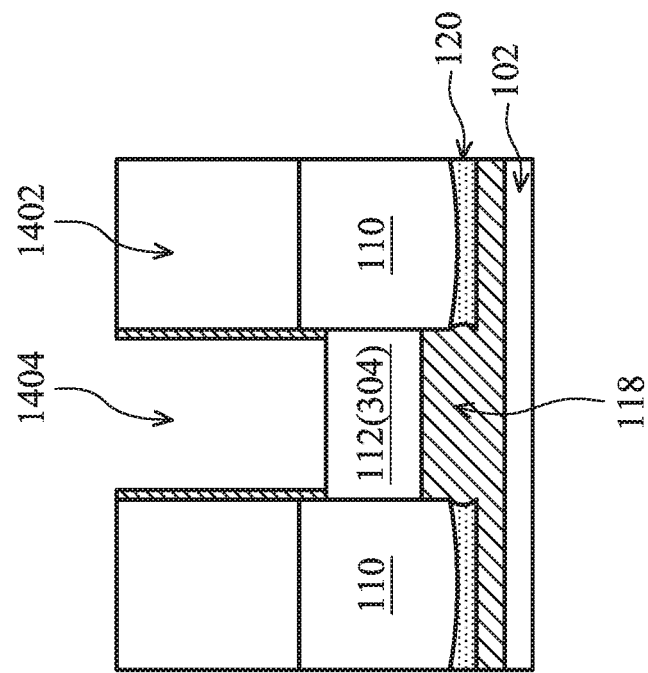
Figure 15A:
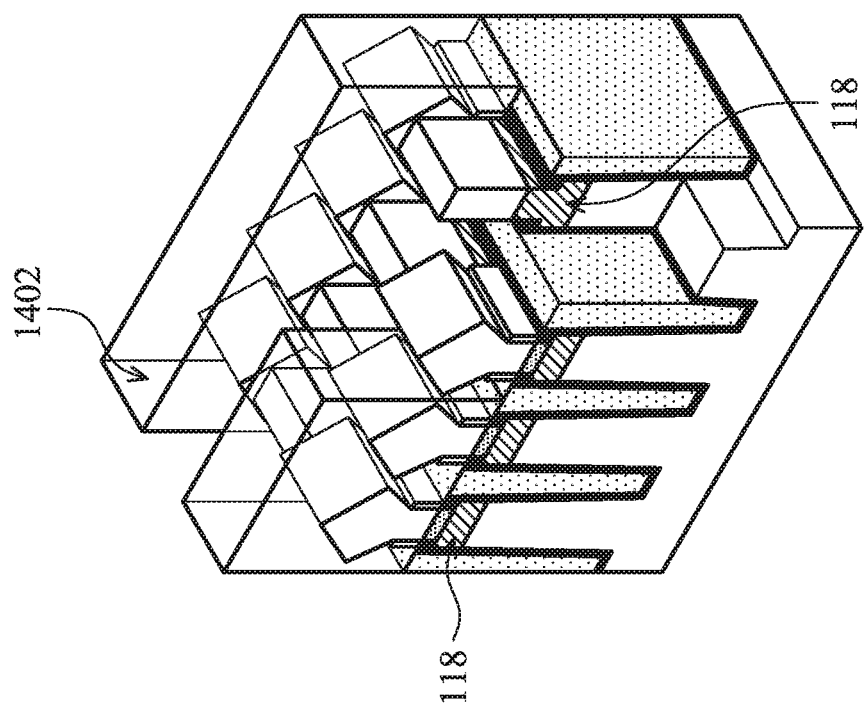

Referring to block 228 of FIG. 2 and to FIGS. 15A and 15B, the semiconductor layer 120 within the gate trench 1404 is oxidized, thereby completely isolating the fin structure 104 from the substrate 102. In the present embodiment, after the removal of the dummy gate stack, the semiconductor layer 120 within the channel region 112 is exposed since the STI features 116 are recessed previously to expose the semiconductor layer 120.

The semiconductor layer 120 within the channel region 112 is fully oxidized and converted into a portion of the buried isolation layer 118 such that the fin active region is electrically isolated from the substrate 102. The oxidization process at the present operation is a selective oxidization tuned such that only the first semiconductor material is oxidized while the semiconductor material of the substrate 102, being different from the first semiconductor material in composition, is selectively not oxidized during the oxidation process.

Thus formed buried isolation layer 118 provides full isolation of the fin structure 104 from the substrate 102, thereby effectively reducing (or eliminating) the anti-punch-through effect, reducing the leakage, and enhancing the device performance. Any suitable selective oxidation process may be used to oxidize the exposed semiconductor material of the semiconductor layer 120. In the present embodiment, the semiconductor material of the semiconductor material layer 120 is silicon germanium while the semiconductor materials of the substrate 102 and the second semiconductor material layer 304 are both silicon. The oxidation process is tuned to selectively oxidize silicon germanium. In furtherance of the embodiment, a wet oxidation process is used because it tends to selectively oxidize germanium within the semiconductor layer 120 without oxidizing silicon within the substrate 102 and/or the second semiconductor material layer 304. For example, the substrate 102 may be heated to and maintained at between about 400° C. and about 600° C. while pure water (vapor) is supplied to the substrate 102 in an environment maintained at about 1 Atm. of pressure for between about thirty minutes and about one hour. The oxidation technique forms a SiGe oxide buried isolation layer 118 separating the fin structure 104 and the substrate 102.

Figure 16B:
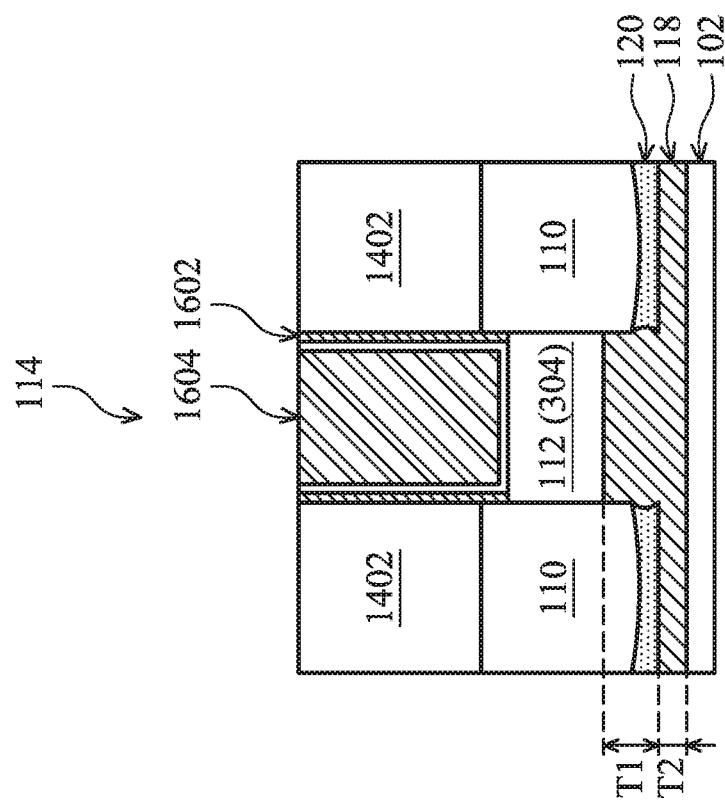
Figure 16A:
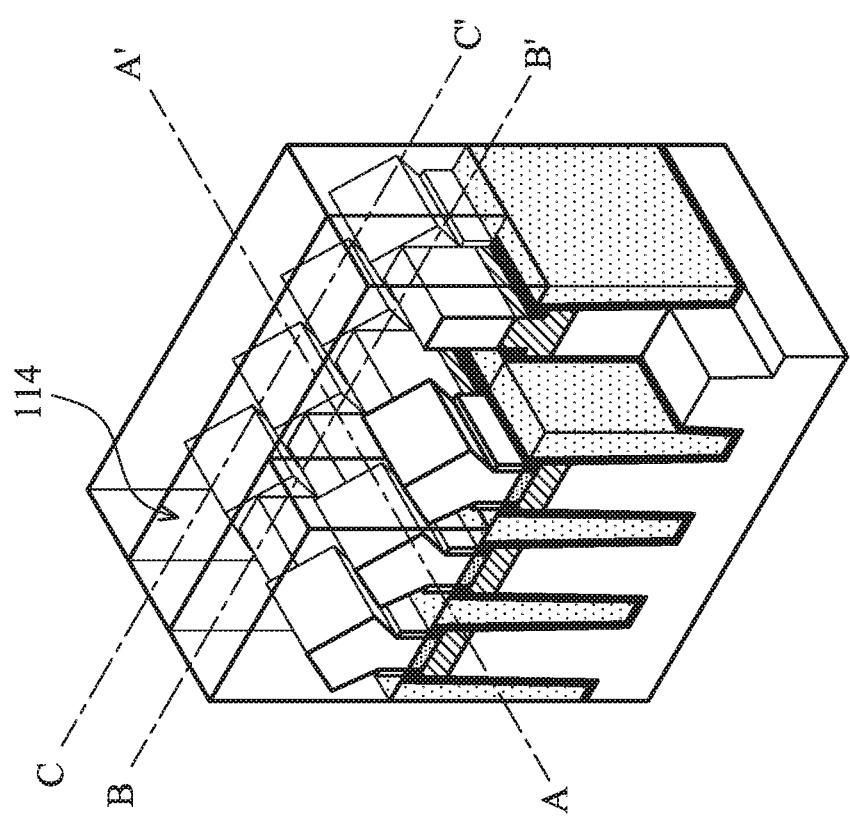
Figure 16D:
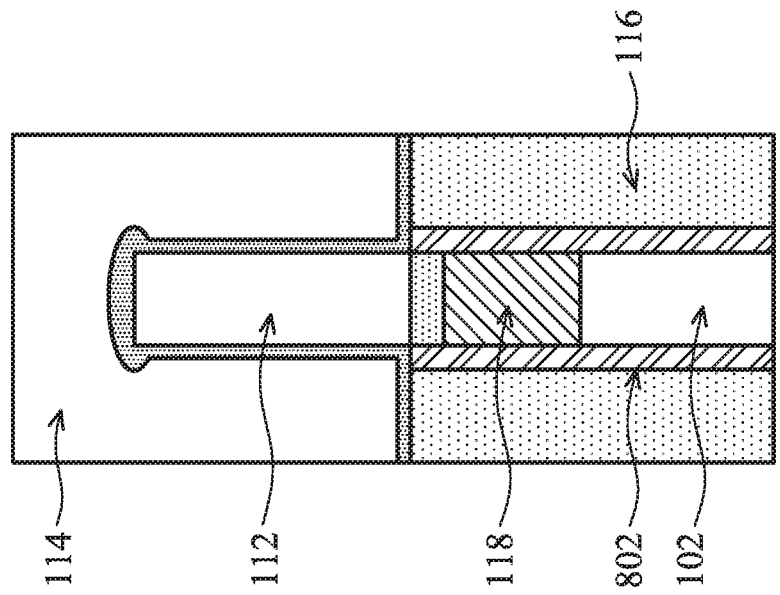
Figure 16C:
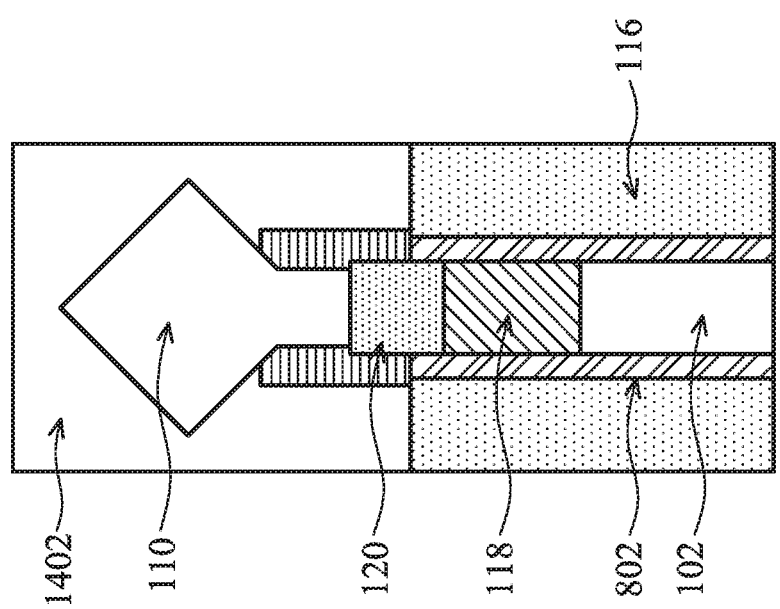
Figure 17:
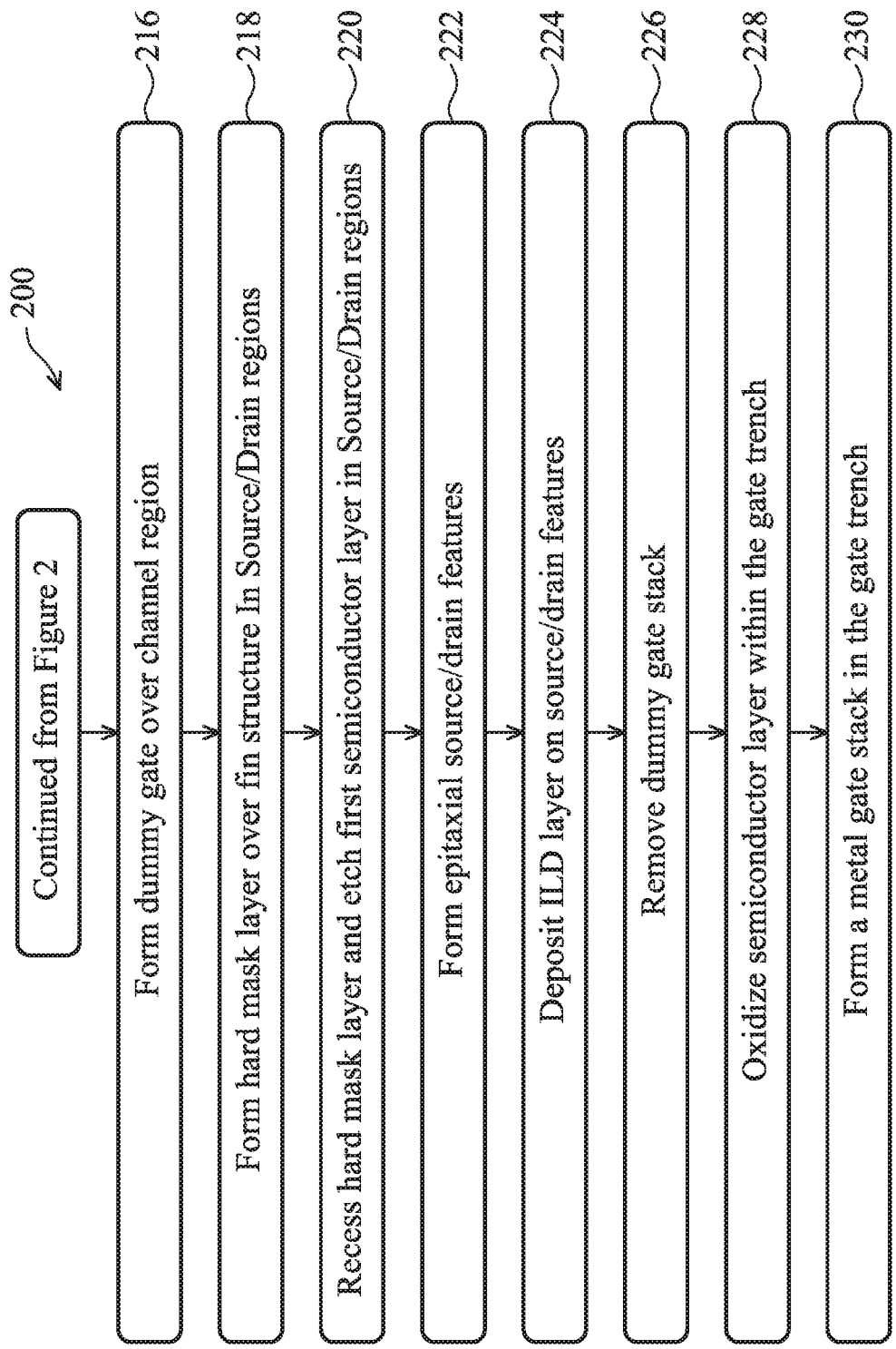
FIG. 17 is a flowchart of a method in accordance with some embodiments.

Referring to block 230 of FIG. 2 and to FIGS. 16A, 16B, 16C and 16D, a gate stack 114 is formed on the workpiece 100. FIG. 16A is a schematic view, FIGS. 16B, 16C and 16D are sectional views of the workpiece 100 along the dashed line AA', BB' and CC', respectively. The gate stack 114 is formed on the workpiece 100 wrapping around the channel regions 112 of the fin structure 104. The gate stack 114 is formed in the gate trench 1404 by a procedure, such as a procedure that includes deposition and CMP. Although it is understood that the gate stack 114 may be any suitable gate structure, in some embodiments, gate stack 114 is a high-k metal gate that includes a gate dielectric layer 1602, and a gate electrode layer 1604 that each may include a number of sub-layers.

In one such embodiment, the gate dielectric layer 1602 includes an interfacial layer deposited by a suitable method, such as ALD, CVD, ozone oxidation, etc. The interfacial layer may include silicon oxide, HfSiO, silicon nitride, silicon oxynitride, and/or other suitable material. In some embodiments, the gate dielectric layer 1602 includes a high-k dielectric layer deposited on the interfacial layer by a suitable technique, such as ALD, CVD, metal-organic CVD (MOCVD), PVD, thermal oxidation, combinations thereof, and/or other suitable techniques. The high-k dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials.

The gate electrode layer 1604 is then formed by ALD, PVD, CVD, or other suitable process, and may include a single layer or multiple layers, such as a metal layer, a liner layer, a wetting layer, and/or an adhesion layer. The gate electrode layer 1604 may include Ti, Ag, Al, TiAlN, TaC, TaCN, TaSiN, Mn, Zr, TiN, TaN, Ru, Mo, Al, WN, Cu, W, or any suitable materials. In some embodiments, different metal gate materials are used for nMOS and pMOS devices. A CMP process may be performed to produce a substantially planar top surface of the gate stack 114. After the gate stack 114 is formed, the workpiece 100 may be provided for further fabrication, such as contact formation and further fabrication of the interconnect structure.

The channel region 112 corresponds to the second semiconductor layer 304 and its thickness Tf represents fin vertical thickness within the channel region. In some examples, the fin thickness Tf ranges from about 10 nm to about 40 nm. As illustrated in FIG. 16B, the buried isolation layer 118 has a continuous structure to separate the channel region 112 and the S/D features 110 from the substrate 102. The buried isolation layer 118 has different thicknesses within the channel region 112 and the S/D regions. Particularly, the buried isolation layer 118 has a first thickness T1 within the channel region 112 and a second thickness T2 within the S/D regions, wherein the first thickness T1 is greater than the second thickness T2. The first thickness T1 is related to the thickness of the first semiconductor material layer 302 and is tuned by the corresponding deposition. In some embodiments, the different of the first and second thicknesses (T1−T2) is greater than the thickness of the semiconductor layer 120 within the S/D region. In some examples, the semiconductor layer 120 within the S/D region has a thickness ranging from about 3 nm to about 15 nm. In some examples, as illustrated in FIG. 16C, the second liner 802 has a thickness ranging from about 20 angstrom to about 60 angstrom. In further examples, the second liner 802 may include silicon nitride, silicon oxynitride, aluminum oxide, or a combination thereof.

The present disclosure provides a technique for forming a fin field-effect transistor (FinFET) underlying with the buried isolation layer to reduce the punch-through effect. The buried isolation layer is formed by two selective oxidation processes, and accordingly has two different thicknesses. The channel region is an un-doped channel region with reduced defects. Accordingly, the carrier mobility is increased, and the device performance is enhanced. In some embodiments, the buried isolation layer includes a silicon germanium oxide. Other alternatives or embodiments may present without departure from the spirit and scope of the present disclosure. The buried isolation layer electrically isolates the channel region and source/drain features from the substrate, thereby reducing the leakage and reducing (or eliminating) punch-through effect.

Thus, the present disclosure provides a semiconductor structure in accordance with some embodiments. The semiconductor structure includes a fin structure formed on a substrate; a gate stack formed over the fin structure; source/drain regions over the substrate and disposed on opposing sides of the gate stack; a channel region defined in the fin structure and underlying the gate stack, wherein the channel region is un-doped; and a buried isolation layer disposed vertically between the channel region and the substrate, wherein the buried isolation layer includes a compound semiconductor oxide.

The present disclosure also provides a semiconductor structure in accordance with some other embodiments. The semiconductor structure includes a fin structure formed on a substrate; a gate stack formed over the fin structure; source/drain regions over the substrate and disposed on opposing sides of the gate stack; a channel region defined in the fin structure and underlying the gate stack; and a buried isolation layer of a compound semiconductor oxide, disposed vertically between the channel region and the substrate, extending to the source/drain regions, wherein the buried isolation layer includes a first thickness within the channel region and a second thickness within the source/drain regions, the second thickness being less than the first thickness.

The present disclosure provides a method of fabricating a nonplanar circuit device in accordance with some embodiments. The method includes receiving a substrate having a first semiconductor layer of a first semiconductor material and a second semiconductor layer of a second semiconductor material on the first semiconductor layer, wherein the second semiconductor material is different from the first semiconductor material in composition; patterning the first and second semiconductor layers to form a fin structure in the second semiconductor layer; performing a first selective oxidization process to the first semiconductor layer such that a bottom portion of the first semiconductor layer is oxidized; forming a dummy gate over a channel region of the fin structure; removing the dummy gate, thereby resulting in a gate trench; and performing a second selective oxidization process to the first semiconductor layer such that a top portion of the first semiconductor layer within the gate trench is oxidized.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a fin structure that includes a first material portion disposed between second material portions, wherein the first material portion includes:
      a first semiconductor oxide layer having a first thickness, and
      a first semiconductor layer disposed on the first semiconductor oxide layer, and
   further wherein the second material portions include:
      a second semiconductor oxide layer having a second thickness, wherein the first thickness is greater than the second thickness,
      a second semiconductor layer disposed on the second semiconductor oxide layer, and
      a third semiconductor layer disposed on the second semiconductor layer; and
   a gate structure disposed over the first material portion.

2. The device of claim 1, wherein the first thickness is greater than a sum of the second thickness and a thickness of the second semiconductor layer.

3. The device of claim 1, wherein the first semiconductor layer is free of dopant.

4. The device of claim 1, wherein the first semiconductor layer, the second semiconductor layer, and the third semiconductor layer include different compositions.

5. The device of claim 1, further comprising a dielectric liner layer disposed along sidewalls of a portion of the fin structure, such that the dielectric liner layer physically contacts the first semiconductor oxide layer, the second semiconductor oxide layer, and the second semiconductor layer.

6. The device of claim 5, further comprising an isolation material disposed over the dielectric liner layer, wherein the isolation material and the dielectric liner layer form an isolation feature.

7. The device of claim 5, wherein the dielectric liner layer includes silicon nitride, silicon oxynitride, aluminum oxide, or a combination thereof.

8. The device of claim 5, wherein a thickness of the dielectric liner layer is about 20 angstroms to about 60 angstroms.

9. The device of claim 1, wherein the gate structure includes a gate electrode disposed over a gate dielectric, wherein the gate dielectric is disposed on the first semiconductor layer of the first material portion of the fin structure.

10. A device comprising:
    a fin that includes:
       a first layer that includes a first semiconductor material,
       a second layer disposed on the first layer, wherein the second layer includes:
          first portions having a semiconductor portion disposed over a semiconductor oxide portion, wherein the semiconductor portion includes a second semiconductor material; and
          a second portion disposed between the first portions, wherein the second portion has the semiconductor oxide portion and is free of the semiconductor portion,
       a third layer that includes a third semiconductor material disposed on the semiconductor portion of the first portions of the second layer, wherein a source region and a drain region are defined in the third layer, and
       a fourth layer that includes a fourth semiconductor material disposed on the semiconductor oxide portion of the second portion of the second layer, wherein a channel region is defined in the fourth layer between the source region and the drain region defined in the third layer; and
    a gate structure disposed over the channel region defined in the fourth layer of the fin, wherein the gate structure includes a gate stack having spacers disposed along sidewalls of the gate stack.

11. The device of claim 10, wherein a thickness of the first portions of the second layer is less than a thickness of the second portion of the second layer.

12. The device of claim 10, wherein:
    the first semiconductor material of the first layer includes silicon;
    the second semiconductor material of the semiconductor portion of the first portions of the second layer and the semiconductor oxide portion of the first portions and the second portion of the second layer include silicon and germanium, wherein the semiconductor oxide portion of the first portions and the second portion of the second layer further include oxygen;
    the third semiconductor material of the third layer includes silicon and dopant; and
    the fourth semiconductor material of the fourth layer includes silicon and is substantially free of dopant.

13. The device of claim 12, wherein the third semiconductor material of the third layer further includes germanium.

14. The device of claim 10, wherein a thickness of the semiconductor oxide portion of the first portions of the second layer is less than a thickness of the semiconductor oxide portion of the second portion of the second layer.

15. The device of claim 10, wherein the second semiconductor material of the semiconductor portion of the first portions of the second layer includes a compound semiconductor material and the fourth semiconductor material of the fourth layer includes an elementary semiconductor material.

16. A device comprising:
- a fin structure disposed on a substrate, wherein the fin structure includes:
  - a first silicon layer,
  - a silicon germanium oxide layer disposed on the first silicon layer, wherein the silicon germanium oxide layer has a first portion having a first thickness, a second portion having a second thickness, and a third portion having the second thickness, wherein the first portion is disposed between the second portion and the third portion, and further wherein the first thickness is greater than the second thickness,
  - a silicon germanium layer disposed on the second portion of the silicon germanium oxide layer and the third portion of the silicon germanium oxide layer,
  - a semiconductor layer disposed on the silicon germanium layer, and
  - a second silicon layer disposed on the first portion of the silicon germanium oxide layer; and
- a high-k/metal gate disposed on the second silicon layer.

17. The device of claim 16, wherein the second silicon layer is undoped.

18. The device of claim 16, wherein a thickness of the second silicon layer is about 10 nm to about 40 nm.

19. The device of claim 16, wherein the semiconductor layer is a third silicon layer.

20. The device of claim 16, wherein the silicon germanium layer is a first semiconductor germanium layer and the semiconductor layer is a second semiconductor germanium layer.

* * * * *